(12) United States Patent
Benzel et al.

(10) Patent No.: US 8,318,544 B2
(45) Date of Patent: Nov. 27, 2012

(54) METHOD FOR MANUFACTURING A PLURALITY OF THIN CHIPS AND CORRESPONDINGLY MANUFACTURED THIN CHIP

(75) Inventors: Hubert Benzel, Pliezhausen (DE); Karl-Heinz Kraft, Herrenberg (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 16 days.

(21) Appl. No.: 12/949,116

(22) Filed: Nov. 18, 2010

(65) Prior Publication Data

US 2011/0115095 A1 May 19, 2011

(30) Foreign Application Priority Data

Nov. 18, 2009 (DE) .......................... 10 2009 046 800

(51) Int. Cl.
*H01L 21/00* (2006.01)
(52) U.S. Cl. ....................................... 438/118
(58) Field of Classification Search .................. 438/118
See application file for complete search history.

(56) References Cited

U.S. PATENT DOCUMENTS

2006/0043599 A1* 3/2006 Akram et al. ................. 257/774
2007/0102735 A1* 5/2007 Kanemoto et al. ........... 257/288
* cited by examiner

*Primary Examiner* — Charles Garber
*Assistant Examiner* — Andre' C Stevenson
(74) *Attorney, Agent, or Firm* — Kenyon & Kenyon LLP

(57) ABSTRACT

In a method is for producing through contacts in thin chips, whose functionality is implemented in a layer structure starting from the surface layer of a semiconductor substrate, to separate these chips, the surface layer is structured using the layer structure and at least one cavity is produced below the surface layer, so that the individual chips are defined by trenches opening into the cavity and the individual chips are connected via support elements in the area of the cavity to the substrate below the cavity. The chips are provided with through contacts, in that firstly a contact hole, which extends through the entire layer structure of the chip and opens into a support element, is produced for each through contact. At least one dielectric layer is applied to the thus structured layer structure and in particular to the wall of the contact holes and structured in accordance with the electrical connections to be created between areas of the chip surface and at least one through contact. A metal plating, which extends in particular to the wall of the contact holes and the surface areas of the layer structure which adjoin the contact holes, is applied thereon and structured. Finally, the contact holes which are thus metal-plated are also filled using a solder.

11 Claims, 3 Drawing Sheets

US 8,318,544 B2

METHOD FOR MANUFACTURING A PLURALITY OF THIN CHIPS AND CORRESPONDINGLY MANUFACTURED THIN CHIP

CROSS REFERENCE TO RELATED APPLICATIONS

The present application claims priority to Application No. 10 2009 046 800.5, filed in the Federal Republic of Germany on Nov. 18, 2009, which is expressly incorporated herein in its entirety by reference thereto.

FIELD OF THE INVENTION

The present invention is directed to a method for manufacturing a plurality of thin chips, whose functionality is implemented in a layer structure, starting from the surface layer of a semiconductor substrate. In this method, the surface layer is structured using the layer structure and at least one cavity is produced below the surface layer, so that the individual chips are defined by trenches opening into the cavity. The individual chips are connected to the substrate below the cavity via support elements in the area of the cavity. These support elements are only disconnected upon separation of the chips.

BACKGROUND INFORMATION

The market for electronic devices is increasingly determined by the demand for greater functionality at minimal device size. In order to meet these demands, not only the semiconductor components must be increasingly integrated, but miniaturization measures must also be taken in the packaging so that the savings may also be implemented at the chip level in the form of a size reduction of entire components. This is true both for the packaging of pure IC chips and also for the packaging of MEMS chips and a combination of both, as is typically used in sensors. It proves to be advantageous in this context to stack two or more chips. The footprint of the resulting component may be limited to the dimensions of the largest chip. The contacting of the individual chips among one another and also the external contacting of such a chip stack are advantageously performed via so-called through contacts. It is conventional to implement the through contacts in the form of contact holes, which extend from the chip front side up to the chip rear side, are filled using an electrically conductive material, and are electrically insulated with respect to the carrier material of the chip. Uniform filling of the contact holes is more difficult the higher the aspect ratio of the contact holes, i.e., the greater the ratio of hole depth to hole width.

Thinned chips, so-called thin chips, are preferably used to minimize the component height. They are typically not processed individually, but rather simultaneously for a plurality of chips in the wafer composite. Depending on the chip size and wafer size, several thousand components, which must be separated at the end of the manufacturing process, may be situated on one semiconductor wafer.

A method for simplifying the separation of chips is described in German Published Application 103 50 036. This method is used in particular during the manufacturing of thinned chips, whose functionality is only to be implemented in a surface layer of the semiconductor substrate. The lateral chip boundaries of this thin chip are fixed here with the aid of etched trenches, which completely penetrate the surface layer of the substrate. In addition, cavities are produced below the surface layer using superficial micromechanical methods, so that the individual chips are only connected via support elements in the area of a cavity to the substrate layer below this cavity. To separate the chips, these support elements are mechanically disconnected, for example, in a picking process in the scope of the single-chip mounting.

SUMMARY

Example embodiments of the present invention provide measures for producing through contacts in thin chips, which are compatible with standard semiconductor and MEMS processes and may be performed at the wafer level, i.e., even before the separation of the thin chips.

According to example embodiments of the present invention, the chips are provided with through contacts in that initially a contact hole, which extends through the entire layer structure of the chip and opens into a support element, is created for each through contact. At least one dielectric layer is applied to the thus structured layer structure and in particular to the wall of the contact holes, and the dielectric layer is structured in accordance with the electrical connections to be created between areas of the chip surface and at least one through contact. A metal plating is applied to the structured dielectric layer, in particular to the wall of the contact holes and the surface areas of the layer structure adjoining the contact holes, and structured in accordance with the electrical connections to be created. The contact holes which are thus metal-plated are finally also filled using a solder.

These measures represent a refinement of the method for manufacturing ultrathin chips which is described in German Published Patent Application No. 103 50 036. They may be incorporated additionally or alternatively to the manufacturing of terminal pads in the semiconductor or MEMS process, via which the functionality of the individual chips in the diaphragm layer over the semiconductor substrate is implemented. The positioning of the contact holes and thus the through contacts in the area of the support elements, by which the individual chips are held in the wafer composite, is significant in connection with the method hereof. In this positioning of the contact holes, the hole depth is not critical, as long as the contact hole extends up into the support element, i.e., the hole depth is greater than the diaphragm thickness. To prevent the chip rear sides from also being coated during the subsequent metal plating, the contact holes are implemented as blind holes. The hole cross section must accordingly be smaller than the cross-sectional area of the support element. This results in a relatively small aspect ratio for the contact holes, which is extremely favorable for the filling using solder. The flowability of the solder in connection with the capillary action of the metal-plated contact holes also contributes to uniform filling of the contact holes.

Fundamentally, there are various possibilities for the implementation of the individual steps of the method. The contact holes are thus preferably produced by trenching or reactive ion etching (RIE), but may also be generated in another etching process or by a combination of various etching steps. For example, silicon dioxide, silicon nitride, or also a combination of these materials may be deposited on the structured layer structure as the dielectric layer. This insulation coating may be structured in a wet etching process or also by targeted plasma etching. The metal plating of the contact holes may include only one metal or also a combination of multiple metals and may be single-layered or multilayered.

The solder for filling the metal-plated contact holes is advantageously applied to the upper side of the layer structure even before the separation of the chips. A solder paste may be applied for this purpose, preferably by screen printing, to the metal-plated surface areas of the layer structure, which surround the contact holes. If the layer structure is then subjected to temperatures which are above the melting temperature of the solder, the solder flows into the metal-plated contact holes, which are thus filled. This temperature treatment step advantageously occurs only after the separation of the chips, because in this case only the support elements provided with contact holes must be disconnected, while after the temperature treatment step the through contacts, which are filled with solder, must also be disconnected. However, it may also be advantageous from productivity points of view to perform the temperature treatment step even before the separation of the chips.

The quantity of solder applied to the chip surfaces may be selected such that during the melting procedure, meniscuses having protruding solder contacts form on both sides of the contact holes, i.e., on the chip upper side and also on the chip lower side. In this case, the temperature treatment step is preferably performed only upon the installation of the separated chips. The chips may be soldered directly onto a substrate or another chip in this manner. In particular, chip stacks may thus be implemented particularly easily.

In addition to the above-described manufacturing method, a thin chip is described herein, whose functionality is implemented in a layer structure starting from the surface layer of a semiconductor substrate and which was provided with through contacts as per the method described herein. As a result, each through contact is implemented here in the form of a contact hole, which extends through the entire layer structure of the thin chip and is implemented over the tear-off point of a support element on the chip rear side, on which the thin chip is connected to the semiconductor substrate before the separation. The wall of the contact hole is provided with metal plating, which is electrically insulated by at least one dielectric layer with respect to the layer structure of the thin chip, and the contact hole which is thus metal-plated is filled using a solder. The metal alloy of the solder is advantageously adapted to the metal plating of the contact holes.

Further features and aspects of example embodiments of the present invention are described in more detail below with reference to the appended Figures.

DETAILED DESCRIPTION

Figure 1A:
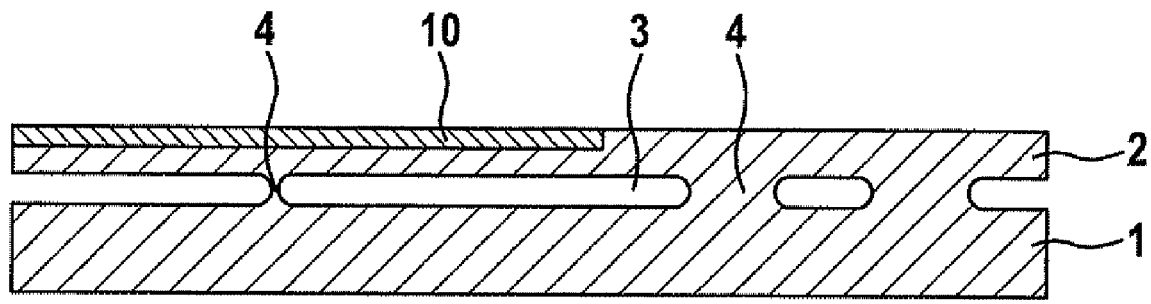
FIGS. 1a through 1d show schematic cross-sectional views of the manufacturing method according to an example embodiment of the present invention up to the metal plating of the contact holes in the layer structure of the thin chips.

A diaphragm substrate, as is partially shown in FIG. 1a, forms the starting point of the method according to an example embodiment of the present invention for manufacturing a plurality of thinned chips. It is a semiconductor wafer, whose surface layer forms a thin functional layer 2 together with a layer structure. The functionality of a plurality of chips 10 is implemented in the layer structure of functional layer 2. These chips may be solely ICs or also MEMS, i.e., chips which also include micromechanical structures in addition to circuit elements. Below functional layer 2 having chip areas 10 is a large-area cavity 3, which ideally extends over the entire wafer area, which is why functional layer 2 is also referred to as a diaphragm layer. The thickness of functional layer 2 is determined by the functionality of the chips to be manufactured and is accordingly between several micrometers and several hundred micrometers. Each chip area 10 is connected via at least one support element 4 to semiconductor substrate 1 below cavity 3.

Figure 1B:
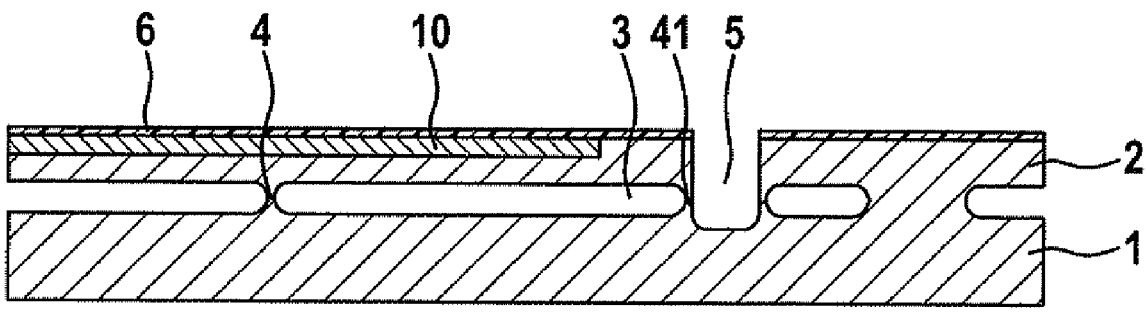

According to example embodiments of the present invention, the through contacts are applied still in the wafer composite, i.e., before the separation of chips 10. In the exemplary embodiment shown here, this is performed after the semiconductor process for implementing the chip functionality is completed. For each through contact, one contact hole 5 is produced, which extends through entire functional layer 2, i.e., over the entire chip thickness. According to example embodiments of the present invention, contact holes 5 are each positioned above a support element 4. As shown in FIG. 1b, the location and cross-sectional area of contact holes 5 may be specified easily with the aid of a photoresist layer 6 which is used as the mask for a subsequent etching process, such as trenching or reactive ion etching. Contact holes 5 are implemented as blind holes in the solid semiconductor material. In the exemplary embodiment shown here, the positioning and dimensions of support element 4 and contact hole 5 are adapted to one another such that only a relatively thin ring 41 made of semiconductor material, which may be disconnected easily in the course of the chip separation, remains of support element 4 as a border for contact hole 5. The depth of contact hole 5 corresponds here to the sum of the chip thickness or diaphragm thickness and the depth of cavity 3.

Photoresist layer 6 is removed again after the etching process for producing contact holes 5. In the next step, a dielectric layer 7 is applied to the structured layer structure, which also extends over the wall of contact holes 5. This dielectric layer 7 may include silicon dioxide, silicon nitride, or also a combination of these materials, for example, and is used as an electrically insulating intermediate layer for a subsequently applied surface metal plating 8, in which external chip contacts are implemented. Correspondingly, dielectric layer 7 is structured to remove the electrical insulation at least in areas 71, in which conductive connections are to be created between circuit elements of individual chips 10 and surface metal plating 8. In other areas of the chip surface, dielectric layer 7 may remain as a "final passivation." Standard etching methods, such as a wet-etching process or targeted plasma etching, may be used for structuring dielectric layer 7.

Figure 1C:
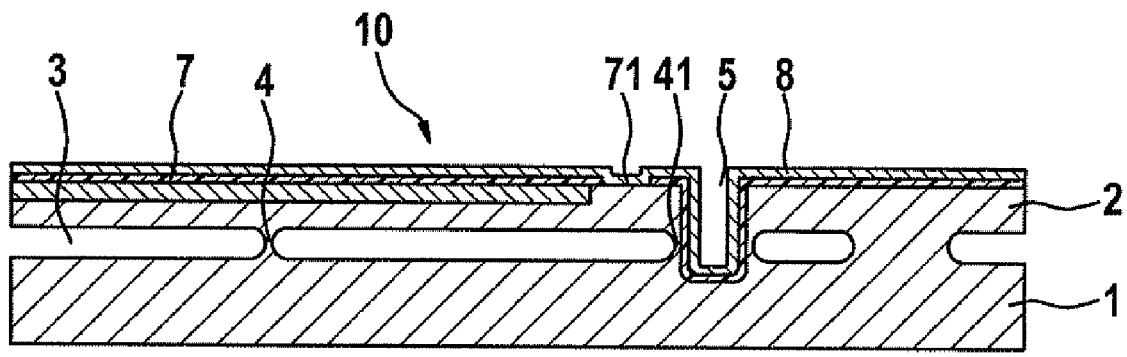

FIG. 1c shows the layer structure after a closed metal plating 8 is applied to structured insulation layer 7. Metal plating 8 may include one metal or also a combination of multiple metals and may be deposited in one layer or also in multiple layers. It is significant in the production of metal plating 8 that good coverage of the hole wall of contact holes 5 is achieved. This is greatly facilitated by the low aspect ratios of contact holes 5. In addition, is advantageous to adapt the material of the last metal layer to the subsequently employed solder material.

Figure 1D:
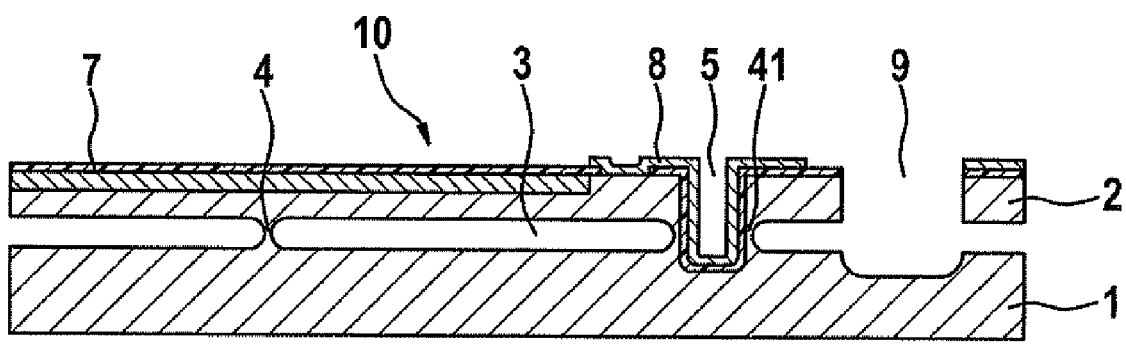

Metal plating 8 is structured such that only the metal plating of contact holes 5 together with the defined adjoining surface areas and the required connections to the established circuit elements of individual chips 10 remain, as shown in FIG. 1d.

The outer edges of individual chips 10 are subsequently exposed in a deep-trenching process or also by sawing, during which trenches 9, which open into cavity 3, are produced in functional layer 2. Chips 10 are now only held by support points 4 or 41 in the wafer composite.

Fundamentally, individual chips 10 may now be picked off of carrier substrate 1 using a suitable tool. Support points 4 or 41 are simply torn through. The metal-plated contact holes are only filled with solder in the scope of the chip mounting during the chip contacting.

Figure 2A:
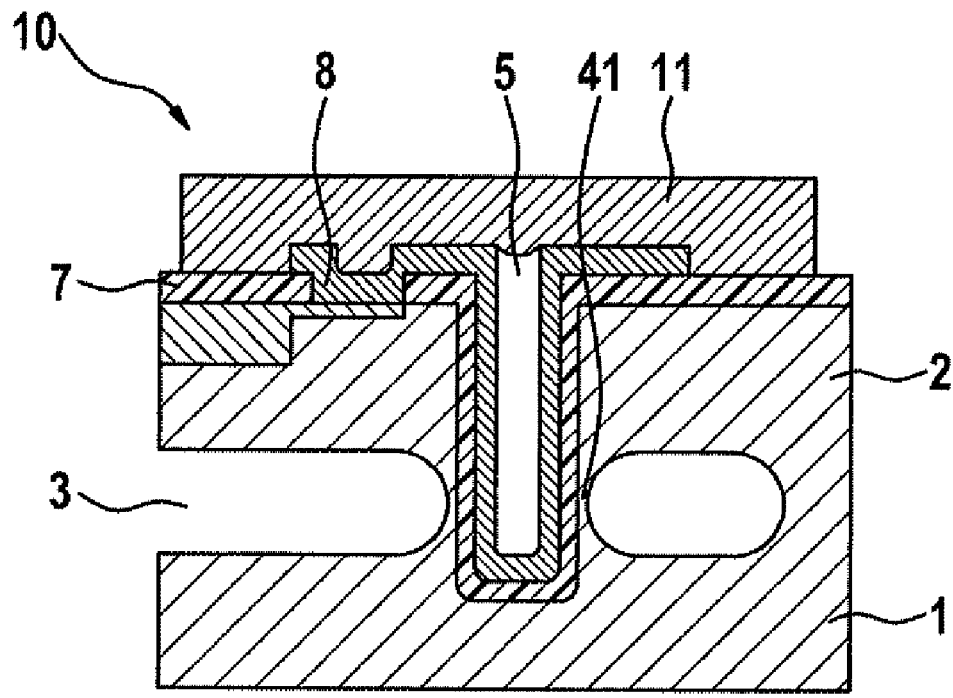
FIGS. 2a and 2b show, on the basis of schematic cross-sectional views in the area of a contact hole, the filling of the metal-plated contact holes using solder.
Figure 2B:
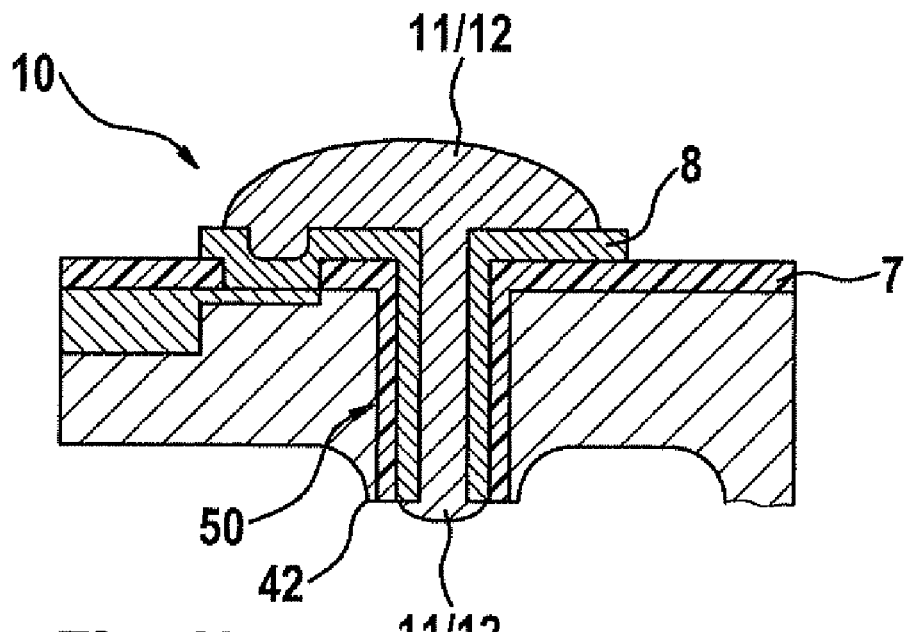

In an example embodiment of the method, which is shown by FIGS. 2a and 2b, the filling of contact holes 5 is already prepared during the processing in the wafer composite, so that solder material 11 employed for this purpose may additionally also be used for the mechanical fixing of chips 10 in the scope of the chip installation. For this purpose, a solder paste 11 is applied to the metal-plated surface areas of the layer construction, which surround contact holes 5, even before the separation of chips 10. This may be performed in a screen printing method, for example. FIG. 2a shows an enlarged detail of carrier substrate 1, which is shown in FIG. 1d, having functional layer 2 in the area of metal-plated contact hole 5 after the application of solder paste 11. Corresponding chip 10 is still held in the wafer composite via support element 41.

Chips 10 are only removed from carrier substrate 1 after the application of solder paste 11. This separation may be performed, for example, in the scope of the chip mounting using the pick, crack, and place method. If thus prepared chips 10 are subjected to a temperature treatment, during which solder 11 melts, solder 11 flows into metal-plated contact holes 5 and fills them. Chip 10 is shown after the separation and after such a temperature treatment in FIG. 2b. Correspondingly, a tear-off point 42, at which support element 41 has been disconnected, may be seen on the chip rear side. Chip 10 now includes a through contact 50 in the form of metal-plated contact hole 5, which is filled with solder 11. The quantity of solder was metered here so that a meniscus 12 has formed in each case on both sides of contact hole 5 due to the surface tension of solder 11. These meniscuses bulge over the chip surfaces and may therefore be used during the chip mounting as solder contacts and for mechanical fixing. Chips prepared in this manner may be mounted directly after the separation on a substrate or another chip, the filling of the contact holes, the electrical contacting, and the mechanical fixing being performed in a single method step, namely a temperature treatment.

The thin chips having through contacts, which are produced hereby, allow simple implementation of chip stacks having a minimal connection length between functionally associated chips of very low thickness. This results in very short signal runtimes, which increases the performance capability of the overall component. In addition, only minimal electromagnetic interference and resistance occur in such chip stacks, which also has an advantageous effect on the performance capability of the component.

What is claimed is:

1. A method for manufacturing a plurality of thin chips, whose functionality is implemented in a layer structure starting from a surface layer of a semiconductor substrate, comprising:
    producing at least one cavity below the surface layer and a plurality of trenches, each opening into at least one of the at least one cavity, wherein individual thin chips are defined by the trenches, and are connected via support elements in an area of the at least one cavity to the substrate below the cavity, and provided with at least one through contact;
    producing a contact hole, which extends through a thin chip and into a support element connecting the thin chip to the substrate, for each through contact;
    applying at least one dielectric layer to the thus structured layer structure and to a wall of the contact holes in accordance with electrical connections to be created between chip surface areas and respective through contacts;
    applying a metal plating to the wall of the contact holes and the surface areas of the layer structure adjoining the contact holes in accordance with the electrical connections to be created, wherein the metal plating is applied after applying the at least one dielectric layer;
    separating the thin chips from the substrate; and
    filling the contact holes with a solder after separating the thin chips from the substrate.

2. The method according to claim 1, wherein, before the separation of the chips, a solder paste is applied to the metal-plated surface areas of the layer structure, which surround the contact holes, so that the solder flows into the metal-plated contact holes upon melting and fills them.

3. The method according to claim 2, wherein a quantity of solder applied to the chip surfaces is selected such that meniscuses having protruding solder contacts form on both sides of the contact holes during the melting process.

4. The method according to claim 3, wherein the solder is only caused to melt after the separation of the chips during their mounting.

5. A thin chip, whose functionality is implemented in a layer structure starting from a surface layer of a semiconductor substrate, having through contacts, wherein:
    each through contact is implemented in the form of a contact hole, which extends through an entire layer structure of the thin chip and is implemented over a tear-off point of a support element on a chip rear side, at which the chip is connected to the semiconductor substrate before separation;
    a wall of the contact hole is provided with a metal plating, which is electrically insulated by at least one dielectric layer with respect to the layer structure of the thin chip; and
    the contact hole which is thus metal-plated is filled using a solder.

6. A method comprising:
    positioning a contact hole over a support element connecting a thin chip to a substrate; and
    extending the contact hole through an entire layer structure of the thin chip and at least a portion of the support element, wherein the positioning and extending of the contact hole forms a tear-off point of the support element at which the thin chip is connected to the substrate before separation.

7. The method of claim 6, further comprising:
    insulating a wall of the extended contact hole; and
    plating the insulated wall of the extended contact hole.

8. The method of claim 6, further comprising:
    separating the thin chip from the substrate; and
    filling the contact hole in the separated thin chip with solder.

9. The method of claim 8, wherein separating the thin chip from the substrate includes tearing through the tear-off point.

10. The method of claim 8, wherein the contact hole is first insulated and then plated before being filled with solder.

11. The method of claim 10, further comprising:
    applying a solder paste to an area surrounding the contact hole before separating the thin chip from the substrate; and
    melting the solder paste during a mounting procedure after separating the thin chip from the substrate to fill the contact hole with solder.

* * * * *